United States Patent
Toyonaka et al.

(10) Patent No.: US 11,476,382 B2
(45) Date of Patent: Oct. 18, 2022

(54) SEMICONDUCTOR LIGHT-RECEIVING ELEMENT

(71) Applicant: Lumentum Japan, Inc., Sagamihara (JP)

(72) Inventors: Takashi Toyonaka, Yokohama (JP); Hiroshi Hamada, Yokohama (JP); Shigehisa Tanaka, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 17/362,316

(22) Filed: Jun. 29, 2021

(65) Prior Publication Data

US 2022/0238745 A1 Jul. 28, 2022

(30) Foreign Application Priority Data

Jan. 26, 2021 (JP) .............................. JP2021-010676
May 6, 2021 (JP) .............................. JP2021-078578

(51) Int. Cl.
*H01L 27/14* (2006.01)
*H01L 31/11* (2006.01)
*H01L 31/103* (2006.01)

(52) U.S. Cl.
CPC .......... *H01L 31/11* (2013.01); *H01L 31/1035* (2013.01)

(58) Field of Classification Search
CPC .............................. H01L 31/11; H01L 31/1035
USPC ....................................................... 257/431
See application file for complete search history.

(56) References Cited

U.S. PATENT DOCUMENTS

| | | | | |
|---|---|---|---|---|
| 6,740,908 | B1 * | 5/2004 | Giboney | H01L 31/105 257/190 |
| 10,978,605 | B2 * | 4/2021 | Toyonaka | H01L 31/1035 |
| 11,133,427 | B2 * | 9/2021 | Iguchi | H01L 27/1446 |
| 2019/0280147 | A1 * | 9/2019 | Toyonaka | H01L 31/105 |

FOREIGN PATENT DOCUMENTS

| | | |
|---|---|---|
| JP | H03-38887 A | 2/1991 |
| JP | 2019-160900 A | 9/2019 |

\* cited by examiner

*Primary Examiner* — Calvin Y Choi
(74) *Attorney, Agent, or Firm* — Harrity & Harrity, LLP

(57) ABSTRACT

A semiconductor light-receiving element, includes: a semiconductor substrate; a high-concentration layer of a first conductivity type formed on the semiconductor substrate; a low-concentration layer of the first conductivity type formed on the high-concentration layer of the first conductivity type and in contact with the high-concentration layer of the first conductivity type; a low-concentration layer of a second conductivity type configured to form a PN junction interface together with the low-concentration layer of the first conductivity type; and a high-concentration layer of the second conductivity type formed on the low-concentration layer of the second conductivity type and in contact with the low-concentration layer of the second conductivity type. The low-concentration layers have a carrier concentration of less than $1 \times 10^{16}/cm^3$. The high-concentration layers have a carrier concentration of $1 \times 10^{17}/cm^3$ or more. At least one of the low-concentration layers includes an absorption layer with a band gap that absorbs incident light.

9 Claims, 12 Drawing Sheets

SEMICONDUCTOR LIGHT-RECEIVING ELEMENT

CROSS-REFERENCE TO RELATED APPLICATIONS

The present application claims priority from Japanese application JP2021-078578 filed on May 6, 2021, which claims priority from Japanese Application JP2021-010676 filed on Jan. 26, 2021, the contents of which are hereby expressly incorporated by reference herein.

TECHNICAL FIELD

This disclosure relates to a semiconductor light-receiving element.

BACKGROUND

A semiconductor light-receiving element for high-speed optical communications can include a PIN-type photodiode, in which an undoped semiconductor layer, which is depleted when a bias voltage is applied under a use state and that serves as an absorption layer for an optical signal from an optical fiber, is sandwiched between p-type and n-type semiconductor layers. In some cases, to achieve both light receiving sensitivity and high-speed responsiveness, a configuration can be used in which an absorption layer is formed of a p-type doped semiconductor layer and an undoped semiconductor layer. In other cases, to achieve a high-speed response to high light input, even at a low voltage, a semiconductor light-receiving element can include an absorption layer that is located between an n-layer and a p-layer and can be formed of a layer containing n-type impurities that gradually decrease in concentration from a junction surface with the n-layer inward, and a layer containing p-type impurities that gradually decrease in concentration from a junction surface with the p-layer inward.

In some cases, to increase a frequency response speed of a semiconductor light-receiving element, it is effective to reduce an element capacitance. The element capacitance is comprised of a PN junction capacitance and a parasitic capacitance, and the PN junction capacitance can be reduced by thickening a depletion layer. For example, an undoped absorption layer can be thickened. However, even when the undoped absorption layer is thickened, unless the entire undoped absorption layer can be depleted at the bias voltage applied under use conditions, an actual depletion layer becomes thinner and a desired capacitance reduction effect cannot be obtained. At a constant bias voltage, as a carrier concentration becomes lower, an actual depletion layer becomes thicker. Therefore, when the undoped absorption layer is an intrinsic semiconductor layer that is completely free of carriers, it is easy to deplete all the undoped absorption layer even at a low voltage.

However, in many cases, the undoped absorption layer actually contains a low concentration of carriers. The undoped absorption layer is formed by epitaxial growth using, for example, an MOCVD method or an MBE method. During this epitaxial growth, the absorption layer is intentionally not doped with p-type or n-type carriers to form the undoped absorption layer. However, the absorption layer actually contains a non-zero background level of carriers, and does not truly form an intrinsic semiconductor layer. The concentration of the unintentionally contained carriers (carriers contained at the background level) depends on the growth device and growing conditions, but is, for example, about $2\times10^{15}/cm^3$ for an n-type. Therefore, when using an actual undoped absorption layer, the area that can be depleted is limited depending on the concentration of carriers contained under a constant voltage. In other words, simply thickening the undoped absorption layer may not be enough to ensure a sufficient thickness of the depletion layer under actual use conditions.

Even when an undoped absorption layer is used as described above, a low concentration of carriers is actually present, and hence an area that can be depleted is limited. When the bias voltage applied is increased, the area that can be depleted is increased, and the capacitance can be reduced even with the same carrier concentration. However, the bias voltage that can be applied to the semiconductor light-receiving element is finite from the viewpoint of power consumption, and it may not be possible to obtain a sufficient bias voltage. Therefore, a semiconductor light-receiving element having a large area that can be depleted with a lower voltage is desired in actual use.

SUMMARY

In some implementations, a semiconductor light-receiving element has a large area that can be depleted, a low capacitance, and excellent high-speed responsiveness.

In some implementations, a semiconductor light-receiving element includes: a semiconductor substrate; a high-concentration layer of a first conductivity type formed on the semiconductor substrate; a low-concentration layer of the first conductivity type formed on the high-concentration layer of the first conductivity type and in contact with the high-concentration layer of the first conductivity type; a low-concentration layer of a second conductivity type configured to form a PN junction interface together with the low-concentration layer of the first conductivity type; and a high-concentration layer of the second conductivity type formed on the low-concentration layer of the second conductivity type and in contact with the low-concentration layer of the second conductivity type, the low-concentration layer of the first conductivity type and the low-concentration layer of the second conductivity type each having a carrier concentration of less than $1\times10^{16}/cm^3$, the high-concentration layer of the first conductivity type having a higher carrier concentration than the low-concentration layer of the first conductivity type, the high-concentration layer of the second conductivity type having a higher carrier concentration than the low-concentration layer of the second conductivity type, the high-concentration layer of the first conductivity type and the high-concentration layer of the second conductivity type each having a carrier concentration of $1\times10^{17}/cm^3$ or more, and at least one of the low-concentration layer of the first conductivity type or the low-concentration layer of the second conductivity type including an absorption layer with a band gap that absorbs incident light.

In some implementations, the semiconductor light-receiving element has a low capacitance and therefore excellent high-speed responsiveness can be obtained.

DETAILED DESCRIPTION

Figure 1A:
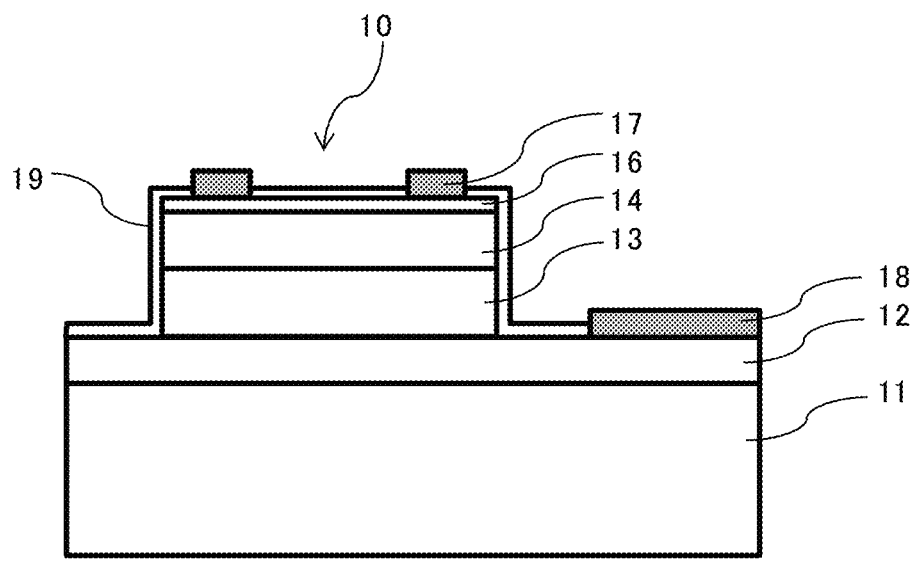
FIG. 1A is a cross-sectional view of a semiconductor light-receiving element according to a first example implementation.

Some implementations are specifically described in detail in the following with reference to drawings. In the drawings, the same members are denoted by the same reference numerals and have the same or equivalent functions, and a repetitive description thereof is omitted. The size of the figure does not necessarily coincide with the magnification.

FIG. 1A is a cross-sectional view of a semiconductor light-receiving element 10 according to a first example implementation. The semiconductor light-receiving element 10 may be a top illuminated semiconductor light-receiving element that is capable of receiving an optical signal having a wavelength that is between a range of 840 nanometers (nm) to 950 nm and that is transmitted through a multimode fiber, for example. The semiconductor light-receiving element 10 includes a semiconductor multilayer obtained by sequentially growing, on a semi-insulating indium phosphide (InP) substrate 11 doped with iron (for example), an n-type InP contact layer 12 with a thickness of 1 micrometer (m) doped with silicon (Si) at a concentration of $5\times10^{18}/cm^3$, an n-type low-concentration indium gallium arsenide (InGaAs) absorption layer 13 with a thickness Wn, a p-type low-concentration InGaAs absorption layer 14 with a thickness Wp and doped with beryllium (Be) at a concentration of $2\times10^{15}/cm^3$, and a p-type InGaAs contact layer 16 with a thickness of 0.1 μm doped with Be at a concentration of $5\times10^{19}/cm^3$. Here, the n-type low-concentration InGaAs absorption layer 13 may be formed as undoped in a multilayer growth, yet may be formed as an n-type semiconductor layer with a carrier density of $2\times10^{15}/cm^3$. Intentionally doping with Si and/or other elements in the multilayer growth may be used to achieve a desired carrier concentration. Further, the n-type low-concentration InGaAs absorption layer 13, the p-type low-concentration InGaAs absorption layer 14, and the p-type InGaAs contact layer 16 may be layers with a band gap that can absorb incident light. In the first example implementation, Wn=0.9 μm, and Wp=0.9 μm. The n-type InP contact layer 12 may be not limited to InP. Similarly, the p-type InGaAs contact layer 16 may also be a semiconductor layer made of another material.

The n-type low-concentration InGaAs absorption layer 13, the p-type low-concentration InGaAs absorption layer 14, and the p-type InGaAs contact layer 16 may be etched into a cylindrical shape to form a light receiving mesa. Further, at the top of the light receiving mesa, a ring-shaped p-type electrode 17 may be electrically connected to the p-type InGaAs contact layer 16. Additionally, an n-type electrode 18 may be electrically connected to the n-type InP contact layer 12. Surfaces excluding portions of the p-type electrode 17 and the n-type electrode 18 may be coated with a silicon nitride film 19. The n-type InP contact layer 12, the n-type low-concentration InGaAs absorption layer 13, the p-type low-concentration InGaAs absorption layer 14, and the p-type InGaAs contact layer 16 may be lattice-matched with the InP substrate 11. The silicon nitride film 19 may function as an anti-reflective film and may have a reflectance of 1% or less for the wavelength of the incident light inside the ring-shaped p-type electrode 17.

In the semiconductor light-receiving element 10, when a reverse bias voltage is applied between the p-type electrode 17 and the n-type electrode 18, the n-type low-concentration InGaAs absorption layer 13 and the p-type low-concentration InGaAs absorption layer 14 may be depleted to serve as absorption layers for signal light with a wavelength between 840 nm and 950 nm that has entered inside the ring shape of the p-type electrode 17. The p-type InGaAs contact layer 16 also may have a band gap that can absorb the incident light, but due to high-concentration doping, may not be depleted at a usage voltage and may not function as an absorption layer. A relationship between carrier concentration and depletion is described herein.

Figure 1B:
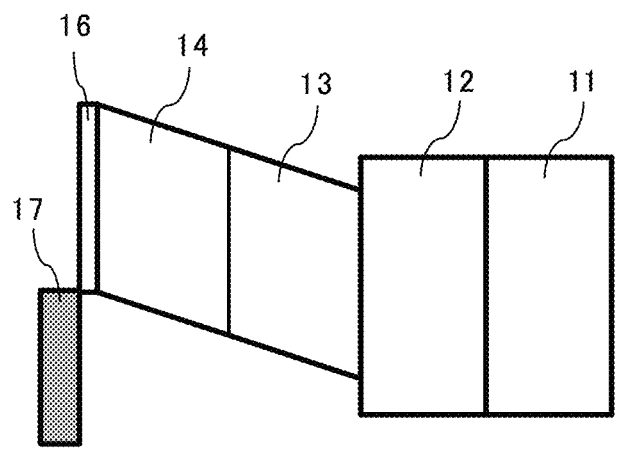
FIG. 1B is a band diagram of the semiconductor light-receiving element according to the first example implementation.

FIG. 1B shows a band diagram of the semiconductor light-receiving element 10 when a reverse bias voltage is applied between the p-type electrode 17 and the n-type electrode 18.

Figure 2:
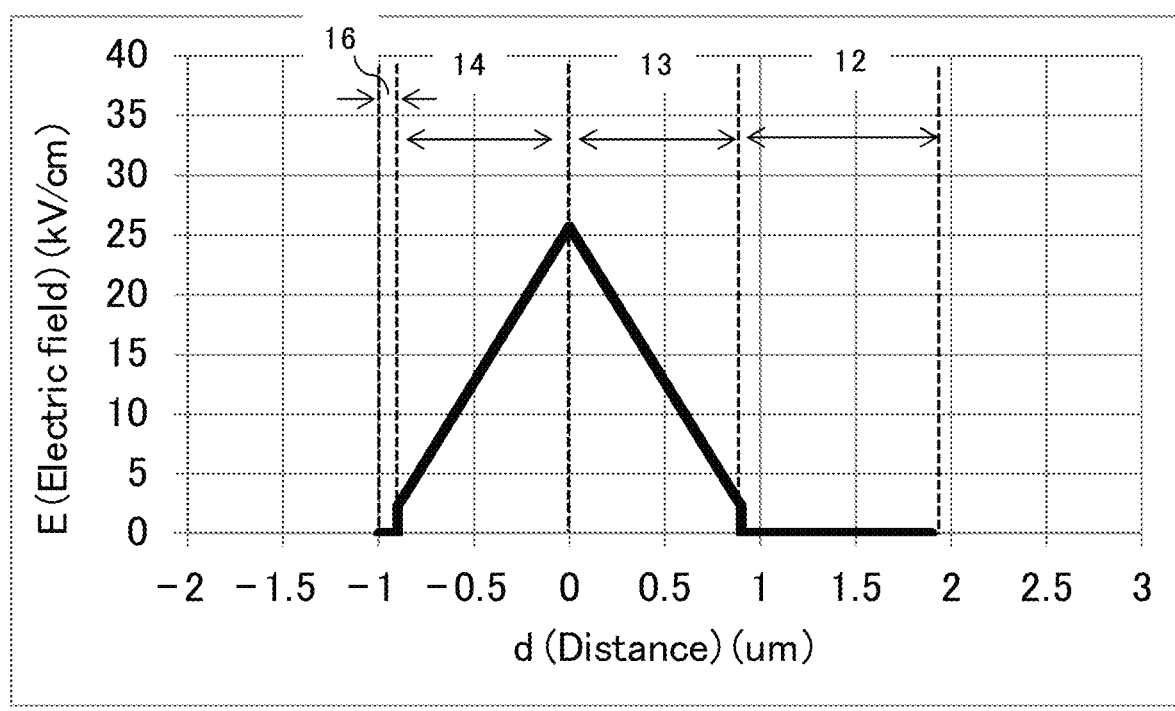
FIG. 2 is a graph showing an electric field strength of the semiconductor light-receiving element according to the first example implementation.

FIG. 2 is a graph showing an electric field strength when a reverse bias voltage of 2 volts (V) is applied between the p-type electrode 17 and the n-type electrode 18. The horizontal axis of FIG. 2 represents a thickness of layers when a PN junction interface is set to 0. In FIG. 2, the + (positive) direction indicates the n-type electrode 18 side of the PN junction interface, and the − (negative) direction indicates the p-type electrode 17 side of the PN junction interface.

Further, the vertical axis represents the electric field strength. The interface between the n-type low-concentration InGaAs absorption layer 13 and the p-type low-concentration InGaAs absorption layer 14 may be the PN junction, at which an electric field strength may be at a maximum, and the electric field strength may decrease as the thickness becomes farther away from the PN junction interface. When an electric field strength at the PN junction interface is represented by E0 (V/m), an electric field strength En (V/m) in the n-type low-concentration InGaAs absorption layer 13 may be expressed by Equation 4.

$$En\ (V/m) = E0 - (q/\varepsilon n) \cdot Nn \cdot Dn \quad \text{[Equation 4]}$$

In Equation 4, q is an elementary charge ($=1.6 \times 10^{19}$ (C)), and εn is a dielectric constant of the n-type low-concentration InGaAs absorption layer 13, which in this case is a dielectric constant of InGaAs ($=1.23 \times 10^{-10}$ (F/m)). Nn is a carrier density of the n-type low-concentration InGaAs absorption layer 13, which is $2 \times 10^{15}/cm^3$. Dn is a distance from the PN junction interface. When a distance from the PN junction interface at which the electric field strength En becomes zero is represented by Dn0, E0 may be expressed by Equation 5.

$$E0 = (q/\varepsilon n) \cdot Nn \cdot Dn0 \quad \text{[Equation 5]}$$

Similarly, an electric field strength Ep (V/m) in the p-type low-concentration InGaAs absorption layer 14 is expressed by Equation 6.

$$Ep\ (V/m) = E0 - (q/\varepsilon p) \cdot Np \cdot Dp \quad \text{[Equation 6]}$$

εp is a dielectric constant of the p-type low-concentration InGaAs absorption layer 14, which in this case is the dielectric constant of InGaAs ($=1.23 \times 10^{-10}$ (F/m)). Further, Np is a carrier density of the p-type low-concentration InGaAs absorption layer 14, which is $2 \times 10^{15}/cm^3$, and Dp is a distance from the PN junction interface. When a distance from the PN junction interface at which the electric field strength Ep becomes zero is represented by Dp0, E0 is expressed by Equation 7.

$$E0 = (q/\varepsilon p) \cdot Np \cdot Dp0 \quad \text{[Equation 7]}$$

When a reverse bias voltage is represented by Vr, and a built-in potential at the interface between the n-type low-concentration InGaAs absorption layer 13 and the p-type low-concentration InGaAs absorption layer 14 is represented by Vb, the sum of a value obtained by integrating the electric field strength En from the PN junction interface to Dn0 and a value obtained by integrating the electric field strength Ep from the PN junction interface to Dp0 is (Vr+Vb) (V), and hence the following Equation 8 is established.

$$E0 \cdot Dp0 + E0 \cdot Dn0 = 2 \cdot (Vr+Vb) \quad \text{[Equation 8]}$$

From Equation 5, Equation 7, and Equation 8, Equation 1, Equation 2, and Equation 3 are derived.

$$Dp0 = \sqrt{\frac{2 \cdot (Vr+Vb)}{\left(\frac{q}{\varepsilon p}\right) \cdot Np \cdot Rp}} \quad \text{[Equation 1]}$$

$$Rp = 1 + (\varepsilon n/\varepsilon p) \cdot (Np/Nn) \quad \text{[Equation 2]}$$

$$Dn0 = (Rp-1) \cdot Dp0 \quad \text{[Equation 3]}$$

An optical module (e.g., an optical transceiver) used for optical communication may be driven by a single 3.3 V power supply. A voltage applied to the semiconductor light-receiving element 10 included in the optical module may be about 2 V at the minimum due to the effect of a voltage drop in an internal circuit (for example, a transimpedance amplifier circuit) of the optical module. Further, the built-in potential is determined by the semiconductor material, which in this case may be 0.54 V because of the PN junction between the InGaAs layers. Here, when Vr=2 V and Vb=0.54 V are substituted into Equation 1, Dp0=0.988 µm is obtained. Further, from Equation 2 and Equation 3, Dn0=0.988 µm is obtained. In other words, it can be seen that, in a case in which the n-type low-concentration InGaAs absorption layer 13 and the p-type low-concentration InGaAs absorption layer 14 each have a carrier concentration of $2 \times 10^{15}/cm^3$, when a voltage of 2 V is applied, the n-type low-concentration InGaAs absorption layer 13 and the p-type low-concentration InGaAs absorption layer 14 can be depleted to a width of 0.988 µm. In the first example implementation, because Wn=0.9 µm and Wp=0.9 µm, the entire area of the n-type low-concentration InGaAs absorption layer 13 and the p-type low-concentration InGaAs absorption layer 14 is depleted. In other words, a width (thickness) over which the semiconductor light-receiving element 10 is depleted may be 1.8 µm.

Accordingly, the absorption layers may be formed of the low-concentration p-type semiconductor layer and the low-concentration n-type semiconductor layer. Here, the low concentration indicates a concentration of a level that allows sufficient depletion when a voltage of several V is applied, which may be used in practical applications. Specifically, a carrier concentration of less than $1 \times 10^{16}/cm^3$ may be preferred. The p-type InGaAs contact layer 16 contains Be at a concentration of $5 \times 10^{19}/cm^3$, and hence is not depleted at several V and does not function, in effect, as an absorption layer. With the absorption layers being formed of the low-concentration p-type semiconductor layer and the low-concentration n-type semiconductor layer, a depletion layer area can be enlarged when a certain bias voltage is applied. As a result, a semiconductor light-receiving element that achieves a reduced capacitance and has excellent high-speed responsiveness is provided.

Figure 3A:
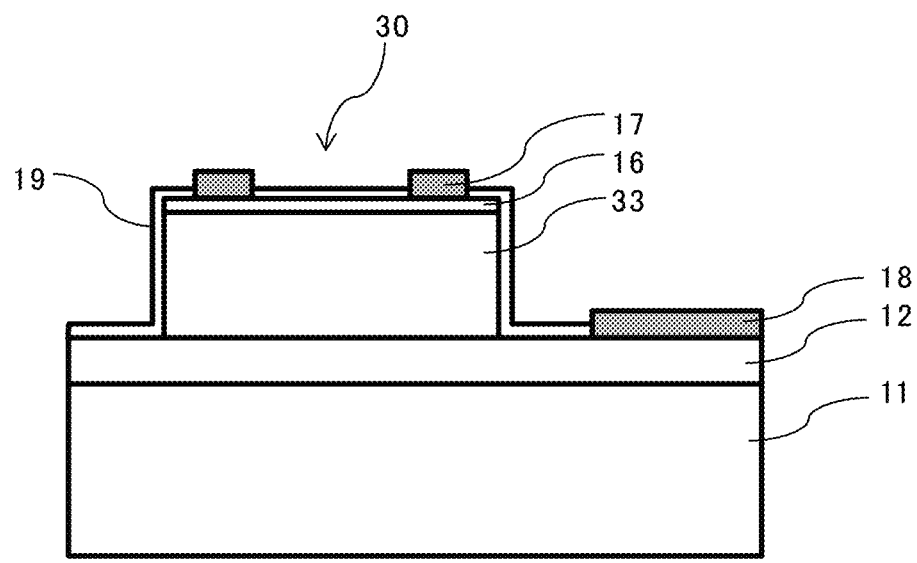
FIG. 3A is a cross-sectional view of a semiconductor light-receiving element according to a comparative example implementation.
Figure 3B:
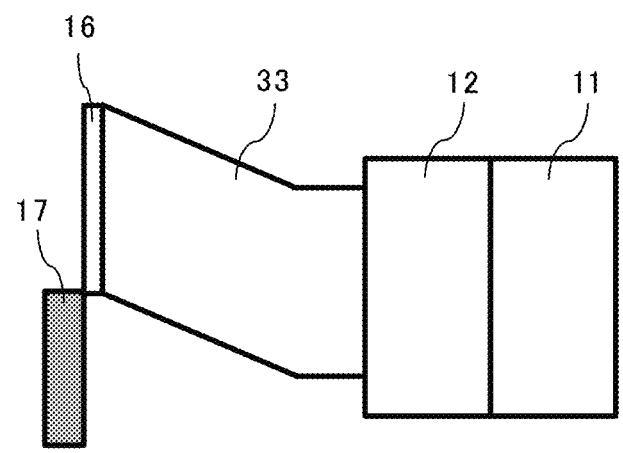
FIG. 3B is a band diagram of the semiconductor light-receiving element according to the comparative example implementation.

FIG. 3A is a cross-sectional view for illustrating a semiconductor light-receiving element 30 according to a comparative example implementation. A difference from the semiconductor light-receiving element 10 according to the first example implementation is the configuration of absorption layers, and the other configurations are the same. An absorption layer of the semiconductor light-receiving element 30 may be formed of an n-type low-concentration InGaAs absorption layer 33 having a thickness Wnc. As with the n-type low-concentration InGaAs absorption layer 13 in the first example implementation, an n-type semiconductor layer has a concentration of n-type carriers contained at a background level of $2 \times 10^{15}/cm^3$. Further, Wnc may be 1.8 µm. In other words, the absorption layer may have the same concentration and the same thickness as the semiconductor light-receiving element 10. The only difference may be that all absorption layers are of n-type. FIG. 3B is a band diagram of the semiconductor light-receiving element 30 when a reverse bias is applied.

Figure 4:
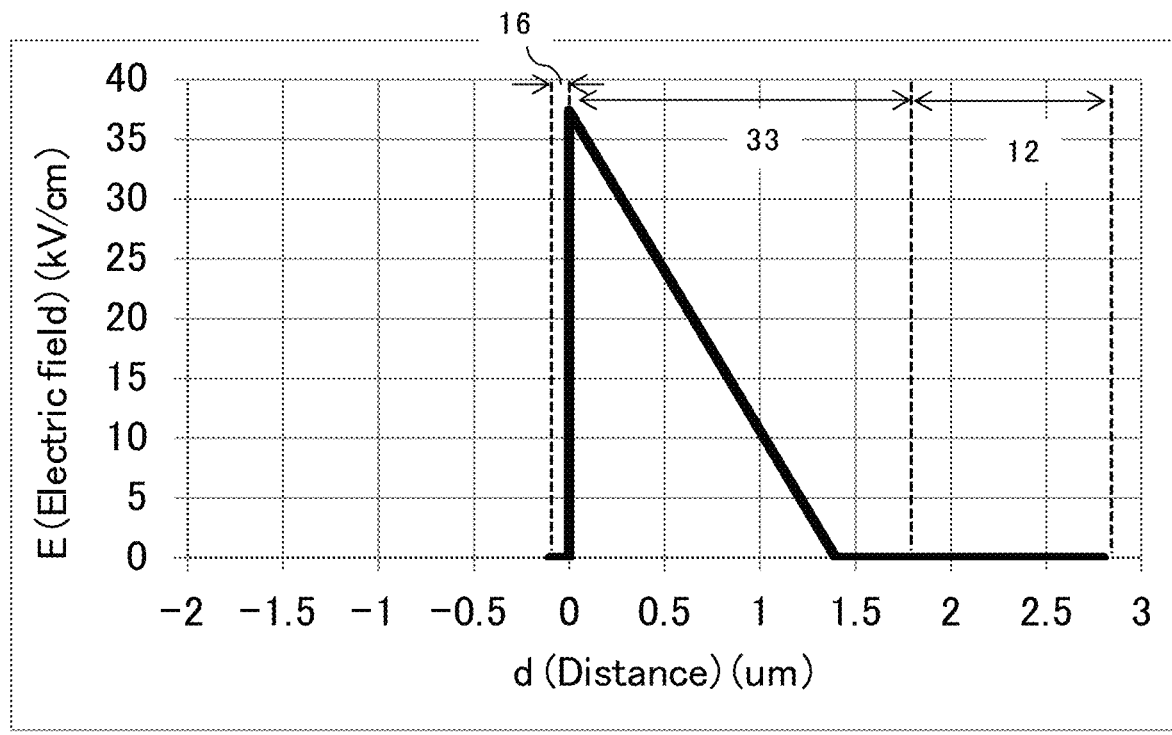
FIG. 4 is a graph showing an electric field strength of the semiconductor light-receiving element according to the comparative example implementation.

FIG. 4 shows, in the comparative example implementation, an electric field strength when a reverse bias voltage of 2 V is applied between the p-type electrode 17 and the n-type electrode 18 of the semiconductor light-receiving element 30. As in FIG. 2, on the horizontal axis, the PN junction interface is set to 0. The interface between the n-type low-concentration InGaAs absorption layer 33 and the p-type InGaAs contact layer 16 may be the PN junction. An electric field strength in the n-type low-concentration InGaAs absorption layer 33 may be at a maximum at the PN junction interface, and may decrease as the thickness becomes further away from the PN junction interface. When an electric field strength at the PN junction interface is represented by E0 (V/m), an electric field strength En (V/m) in the n-type low-concentration InGaAs absorption layer 33 may be expressed by Equation 4. Similarly, when a distance from the PN junction interface at which the electric field strength En becomes zero is represented by Dn0, E0 may be expressed by Equation 5.

When a reverse bias voltage is represented by Vr, and a built-in potential at the interface between the n-type InGaAs absorption layer 33 and the p-type InGaAs contact layer 16 is represented by Vb, a value obtained by integrating an electric field strength E from the PN junction interface to Dn0 is (Vr+Vb)(V), and hence Dn0 may be expressed by Equation 9.

$$Dn0 = \sqrt{\frac{2 \cdot (Vr + Vb)}{\left(\frac{q}{\varepsilon n}\right) \cdot Nn}} \qquad \text{[Equation 9]}$$

When Vr=2 V and Vb=0.54 V are substituted into Equation 9, Dn0=1.397 µm is obtained. In other words, although the n-type low-concentration InGaAs absorption layer 33 has a thickness of 1.8 µm, the n-type low-concentration InGaAs absorption layer 33 is depleted only by 1.397 µm when 2 V is actually applied.

In the semiconductor light-receiving element 10 according to the first example implementation, the n-type low-concentration InGaAs absorption layer 13 and the p-type low-concentration InGaAs absorption layer 14 form the absorption layers, which have a thickness of 1.8 µm. Further, the whole absorption layers are depleted when 2 V is applied. In contrast, in the semiconductor light-receiving element 30 according to the comparative example implementation, the absorption layer is made only of n-type low-concentration InGaAs, and has a thickness of 1.8 µm. However, only a thickness of 1.397 µm is depleted when 2 V is applied. Therefore, the semiconductor light-receiving element 10 according to the first example implementation is a semiconductor light-receiving element having a small capacitance and excellent high-speed responsiveness as compared to the semiconductor light-receiving element 30. Further, for the semiconductor light-receiving element 10 according to the first example implementation, the voltage for obtaining the same depleted area is smaller as compared to the semiconductor light-receiving element 30 according to the comparative example implementation. Therefore, the semiconductor light-receiving element 10 according to the first example implementation is a semiconductor light-receiving element with which the voltage required to obtain the same capacitance, that is, the same level of high-speed responsiveness is small in absolute value, and which is excellent in low power consumption. This characteristic is obtained by the combination of the p-type low-concentration absorption layer and the n-type low-concentration absorption layer each having the concentration of carriers, with which the absorption layers can be depleted, of less than $1 \times 10^{16}/cm^3$.

In some cases, a semiconductor light-receiving element can consist of a layer containing n-type impurities that gradually decrease in concentration from a junction surface with an n-layer inward, and a layer containing p-type impurities that gradually decrease in concentration from a junction surface with a p-layer inward. At the interface between the n-type impurity layer and the p-type impurity layer, the concentrations of the n-type impurities and the p-type impurities are 0. With this structure, both the p-type InGaAs absorption layer and the n-type InGaAs absorption layer have the structure in which the junction surface with the p-type layer or the n-type layer, which may be in contact with the p-type InGaAs absorption layer or the n-type InGaAs absorption layer, has a high concentration of $1 \times 10^{16}/cm^3$ or more, and gradually decreases in concentration from the junction surface inward. Therefore, not all of the n-type impurity layer and the p-type impurity layer are depleted, and only areas having the carrier concentration of less than $1 \times 10^{16}/cm^3$ are depleted. Other cases are directed to generating an internal electric field by the concentration gradient in each impurity layer, and preventing a decrease in carrier movement speed even at a low voltage. Therefore, it is not assumed to set the carrier concentration of the entire impurity layer to less than $1 \times 10^{16}/cm^3$. Further, in the n-type impurity layer, the carrier concentration gradually changes even when the concentration is around $1 \times 10^{16}/cm^3$. Therefore, the electric field is not applied properly to the area to be actually depleted, and the interface between an actual depletion layer and the non-depleted area is blurred. As a result, a sufficient carrier movement speed cannot be obtained, which is disadvantageous in terms of high-speed responsiveness.

In contrast, in the semiconductor light-receiving element 10 according to the first example implementation, the n-type low-concentration InGaAs absorption layer 13 is in contact with the n-type InP contact layer 12 and doped to a high concentration that is equal to or more than 10 times the concentration of the n-type low-concentration InGaAs absorption layer 13, which is $5 \times 10^{18}/cm^3$. Therefore, the electric field is properly applied on the n-type low-concentration InGaAs absorption layer 13, resulting in the semiconductor light-receiving element capable of high-speed response with excellent carrier spitting performance. In order to sufficiently apply an electric field to the depletion layer area, the carrier concentration of the layer in contact with the low-concentration layer is preferably $1 \times 10^{17}/cm^3$ or more.

Figure 5A:
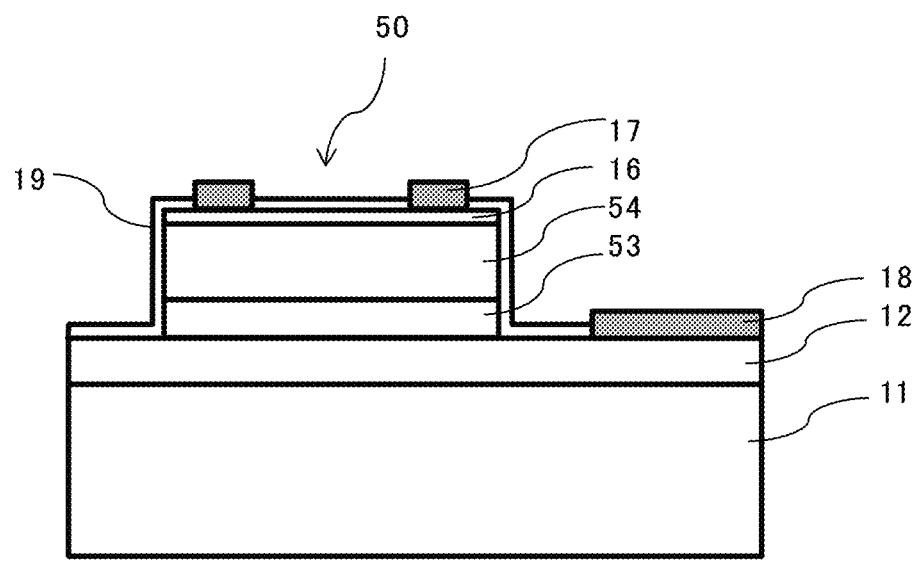
FIG. 5A is a cross-sectional view of a semiconductor light-receiving element according to a second example implementation.
Figure 5B:
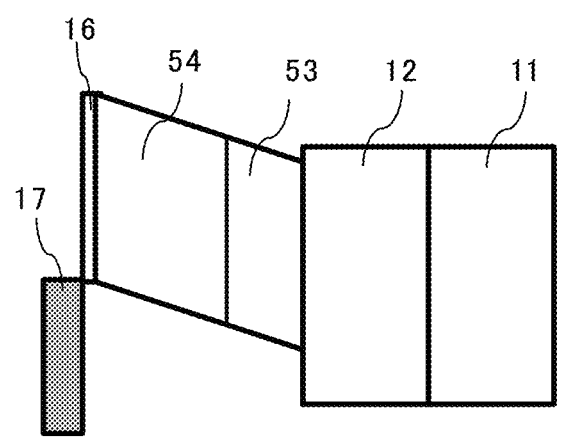
FIG. 5B is a band diagram of the semiconductor light-receiving element according to the second example implementation.

FIG. 5A is a cross-sectional view of a semiconductor light-receiving element 50 according to a second example implementation. FIG. 5B shows a band diagram when a reverse bias voltage is applied to the semiconductor light-receiving element 50. Differences from the semiconductor light-receiving element 10 described in the first example implementation are differences in concentration and thickness between the n-type low-concentration InGaAs absorption layers 13 and 53 and the p-type low-concentration InGaAs absorption layers 14 and 54. In the second example implementation, the n-type low-concentration InGaAs absorption layer 53 has a concentration of $3 \times 10^{15}/cm^3$ and a thickness of 0.6 µm. The p-type low-concentration InGaAs absorption layer 54 has a concentration of $2 \times 10^{15}/cm^3$ and a thickness of 0.9 µm. In other words, the n-type low-concentration InGaAs absorption layer 53 may be formed to be thinner than the p-type low-concentration InGaAs absorption layer 54, and a thickness of the absorption layers as a whole may be 1.5 µm. The other configurations are the same as the semiconductor light-receiving element 10.

Figure 6:
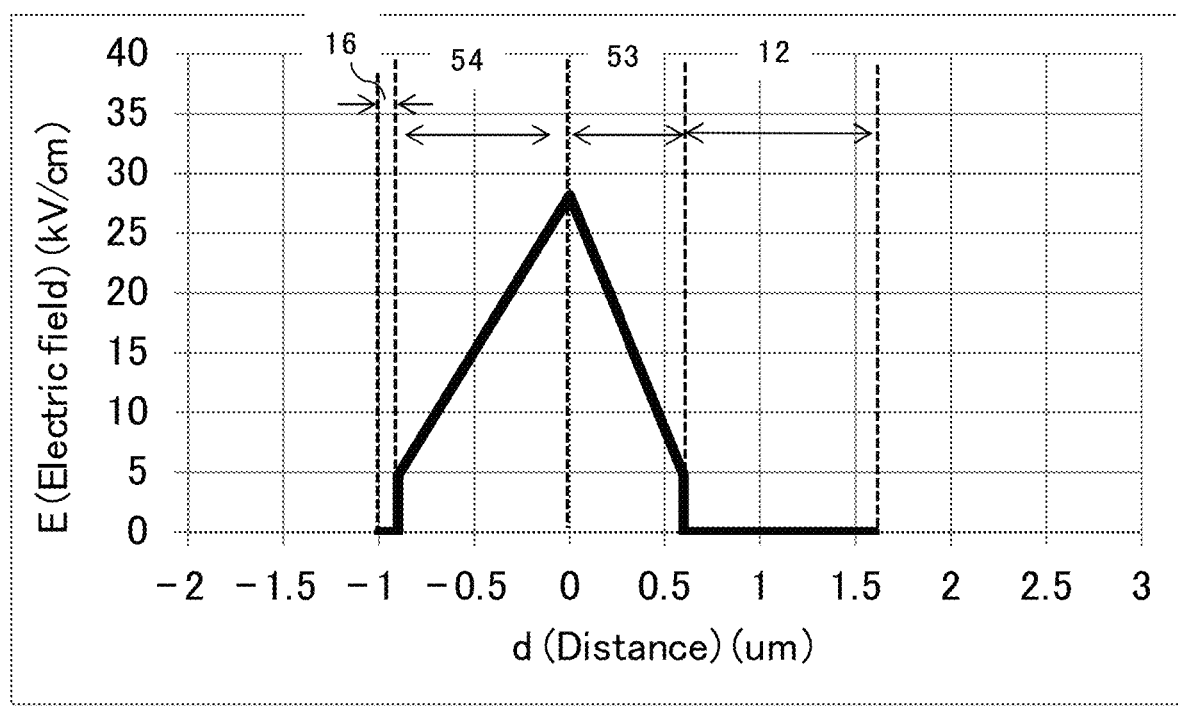
FIG. 6 is a graph showing an electric field strength of the semiconductor light-receiving element according to the second example implementation.

FIG. 6 is a graph showing an electric field strength when a reverse bias voltage of 2 V is applied between the p-type electrode 17 and the n-type electrode 18 of the semiconductor light-receiving element 50. As in FIG. 2, on the horizontal axis, the PN junction interface is set to 0. An area that can be depleted, that is, distances Dn0 and Dp0 from the PN junction interface over which the electric field strength is 0 can be determined based on Equation 1, Equation 2, and Equation 3. When Vr=2 V and Vb=0.54 V are substituted into Equation 1, Equation 2, and Equation 3, Dp0=1.082 μm and Dn0=0.721 μm are obtained. In other words, both the p-type low-concentration InGaAs absorption layer 54 having the thickness of 0.9 μm and the n-type low-concentration InGaAs absorption layer 53 having the thickness of 0.6 μm may all be depleted. Further, when carrier concentrations of the n-type low-concentration InGaAs absorption layer 53 and the p-type low-concentration InGaAs absorption layer 54 have the above values, the maximum depletion layer thickness is Dp0+Dn0=1.803 am. This indicates that although the thickness of the absorption layers may be 1.5 μm in the second example implementation, the absorption layers can all be depleted even when the thickness is 1.803 μm.

Meanwhile, in the comparative example implementation, for example, when the concentration of the n-type low-concentration InGaAs absorption layer 33 is set to $3\times10^{15}/cm^3$, which is the same as that of the n-type low-concentration InGaAs absorption layer 53 in the second example implementation, the width of the maximum depletion area becomes 1.14 μm. Therefore, even with the same carrier concentration, through combination of the p-type low-concentration absorption layer and the n-type low-concentration absorption layer as described in the second example implementation, the width of the maximum depletion area can be widened. Further, as apparent from Equation 1, Equation 2, and Equation 3, the maximum depletion area can be obtained at a certain bias voltage when the p-type low-concentration absorption layer and the n-type low-concentration absorption layer have the same carrier concentration.

Through light absorption, pairs of an electron and a hole are generated. Then, the holes move to the p-type InGaAs contact layer 16 side, and the electrons move to the n-type InP contact layer 12 side. Light is absorbed in the entire absorption layer, and holes generated on a side close to the n-type InP contact layer 12 are required to move over a long distance as compared to holes generated on a side close to the p-type InGaAs contact layer 16. Holes are heavy as compared to electrons, and hence take time to move. In high-frequency driving, holes can be allowed to quickly move from the depletion layer area to increase high-speed responsiveness. In the second example implementation, the PN junction interface at which the electric field strength is maximized is closer to the n-side when the absorption layers are viewed as a whole. Therefore, holes generated in the n-type low-concentration InGaAs absorption layer 53, which are required to move over a longer distance, are applied with a stronger electric field. Consequently, those holes are accelerated by the strong electric field, and hence are allowed to move faster to the p-type InGaAs contact layer 16 side. As a result, it is possible to provide a semiconductor light-receiving element with more superior high-speed responsiveness.

Figure 7A:
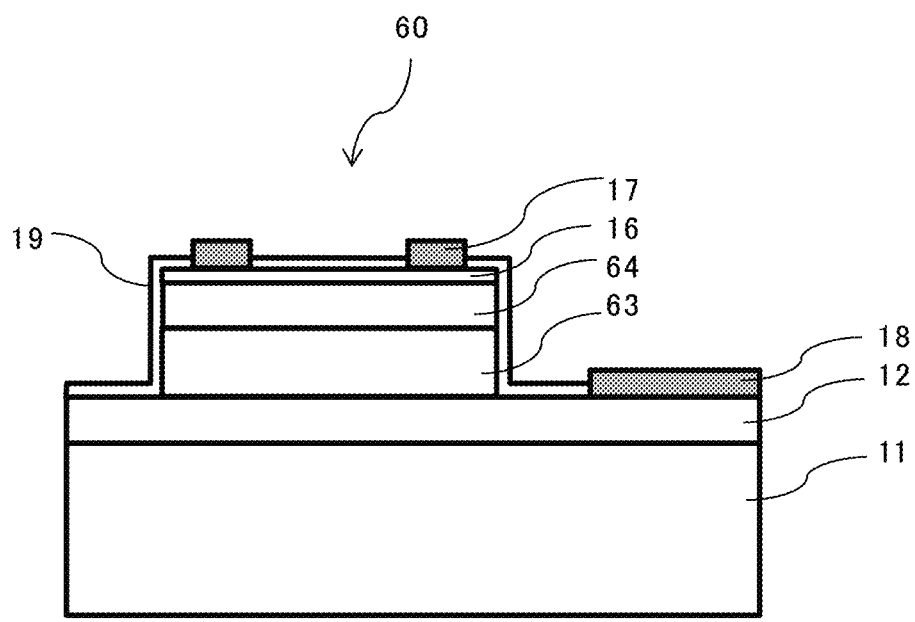
FIG. 7A is a cross-sectional view of a semiconductor light-receiving element according to a third example implementation.
Figure 7B:
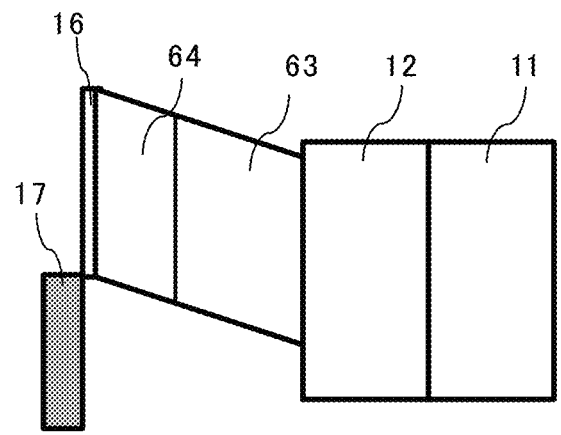
FIG. 7B is a band diagram of the semiconductor light-receiving element according to the third example implementation.

FIG. 7A is a cross-sectional view of a semiconductor light-receiving element 60 according to a third example implementation. FIG. 7B shows a band diagram when a reverse bias voltage is applied to the semiconductor light-receiving element 60. Differences from the semiconductor light-receiving element 10 described in the first example implementation are differences in concentration and thickness between the n-type low-concentration InGaAs absorption layers 13 and 63 and the p-type low-concentration InGaAs absorption layers 14 and 64. In the third example implementation, the n-type low-concentration InGaAs absorption layer 63 has a concentration of $2\times10^{15}/cm^3$ and a thickness of 0.9 μm. The p-type low-concentration InGaAs absorption layer 64 has a concentration of $3\times10^{15}/cm^3$ and a thickness of 0.6 μm. In other words, one (p-type low-concentration InGaAs absorption layer 64) of the n-type low-concentration InGaAs absorption layer 63 and the p-type low-concentration InGaAs absorption layer 64 that is closer to a surface on which light enters may be formed to be thinner than the other (n-type low-concentration InGaAs absorption layer 63), and a thickness of the whole absorption layers may be 1.5 μm. The other configurations are the same as the semiconductor light-receiving element 10.

Figure 8:
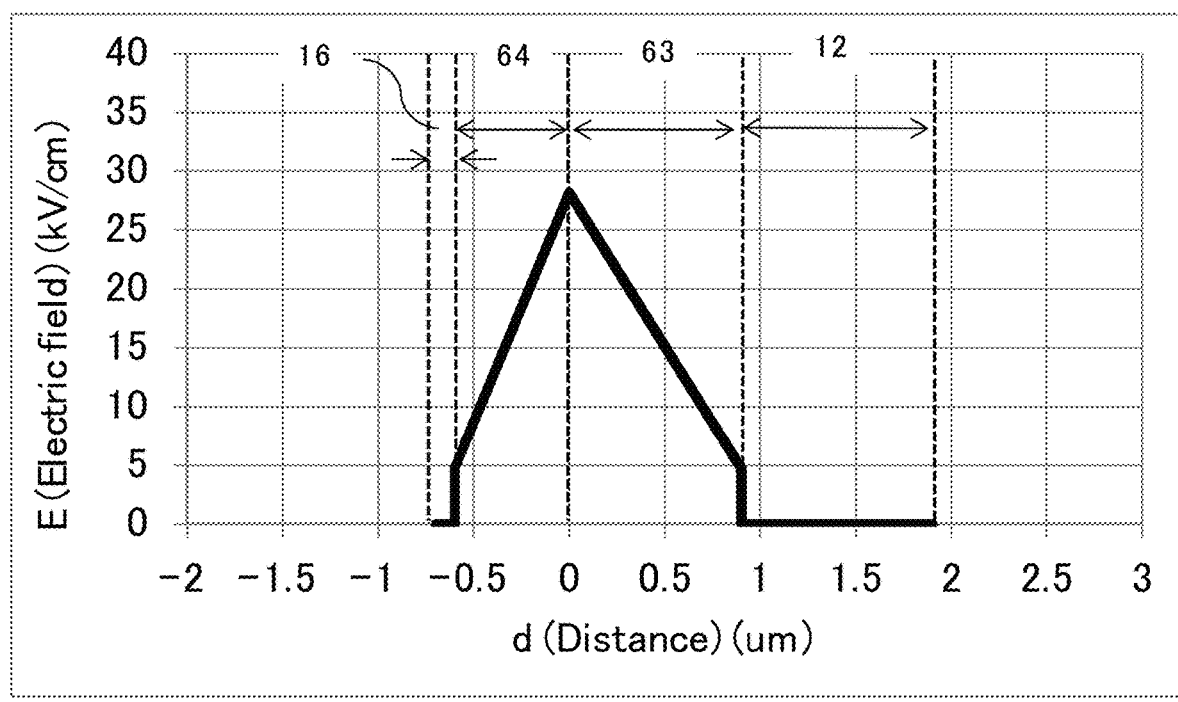
FIG. 8 is a graph showing an electric field strength of the semiconductor light-receiving element according to the third example implementation.

FIG. 8 is a graph showing an electric field strength when a reverse bias voltage of 2 V is applied between the p-type electrode 17 and the n-type electrode 18 of the semiconductor light-receiving element 60. As in FIG. 2, on the horizontal axis, the PN junction interface is set to 0. An area that can be depleted, that is, distances Dn0 and Dp0 from the PN junction interface over which the electric field strength is 0 can be determined based on Equation 1, Equation 2, and Equation 3. When Vr=2 V and Vb=0.54 V are substituted into Equation 1, Equation 2, and Equation 3, Dp0=0.721 μm and Dn0=1.082 μm are obtained. In other words, both the p-type low-concentration InGaAs absorption layer 64 having the thickness of 0.6 μm and the n-type low-concentration InGaAs absorption layer 63 having the thickness of 0.9 μm may all be depleted. Further, when carrier concentrations of the n-type low-concentration InGaAs absorption layer 63 and the p-type low-concentration InGaAs absorption layer 64 have the above values, the maximum depletion layer thickness is Dp0+Dn0=1.803 μm. This indicates that although the thickness of the absorption layers may be 1.5 μm in the third example implementation, the absorption layers can all be depleted even when the thickness is 1.803 μm.

Meanwhile, in the comparative example implementation, for example, when the concentration of the n-type low-concentration InGaAs absorption layer 33 is set to $2\times10^{15}/cm^3$, which is the same as that of the n-type low-concentration InGaAs absorption layer 63 in the third example implementation, the width of the maximum depletion area becomes 1.14 μm. Therefore, even with the same carrier concentration, through combination of the p-type low-concentration absorption layer and the n-type low-concentration absorption layer as described in the third example implementation, the width of the maximum depletion area can be widened.

The semiconductor light-receiving element 60 may be a top illuminated optical semiconductor light-receiving element, and a received optical signal may pass through the p-type InGaAs contact layer 16 to enter the p-type low-concentration InGaAs absorption layer 64. The optical signal may reach the n-type low-concentration InGaAs absorption layer 63 while being absorbed in the p-type low-concentration InGaAs absorption layer 64, and also may be absorbed in the n-type low-concentration InGaAs absorption layer 63. Therefore, an amount of light absorbed in the p-type low-concentration InGaAs absorption layer 64 may be larger than an amount of light absorbed in the n-type low-concentration InGaAs absorption layer 63. Therefore, an amount of pairs of a hole and an electron that are generated by light absorption may be also be larger in the area of the p-type low-concentration InGaAs absorption layer 64. In order to allow the large amount of generated carriers to move at high speed, it may be preferred that a strong electric field be applied. In the third example implementation, a higher electric field strength can be applied on the p-type low-concentration InGaAs absorption layer 64 with the larger amount of light absorption, and the carriers are allowed to move efficiently.

As described in the second example implementation, it may be better to increase the electric field strength of the n-type low-concentration InGaAs absorption layer 63 in some cases. For example, in the case of the top illuminated type, the semiconductor light-receiving element 60 according to the third example implementation may be preferred in order to allow a larger amount of carriers generated on the p-side to move. In contrast, in a case of a back illuminated semiconductor light-receiving element, it may be the n-type low-concentration InGaAs absorption layer 63 that absorbs a larger amount of light, and the semiconductor light-receiving element 50 according to the second implementation may be better in high-speed responsiveness. Further, even in a top illuminated semiconductor light-receiving element, which of extractability of carriers to be largely generated on the p-side and extractability of holes on the n-side is caused to affect high-speed responsiveness as a whole, depends on an incident light intensity, an applied voltage, and further, thicknesses and concentrations of the absorption layers, for example. Therefore, it may be preferred to determine the thicknesses and the concentrations of the p-type low-concentration absorption layer and the n-type low-concentration absorption layer as part of a whole design.

Figure 9A:
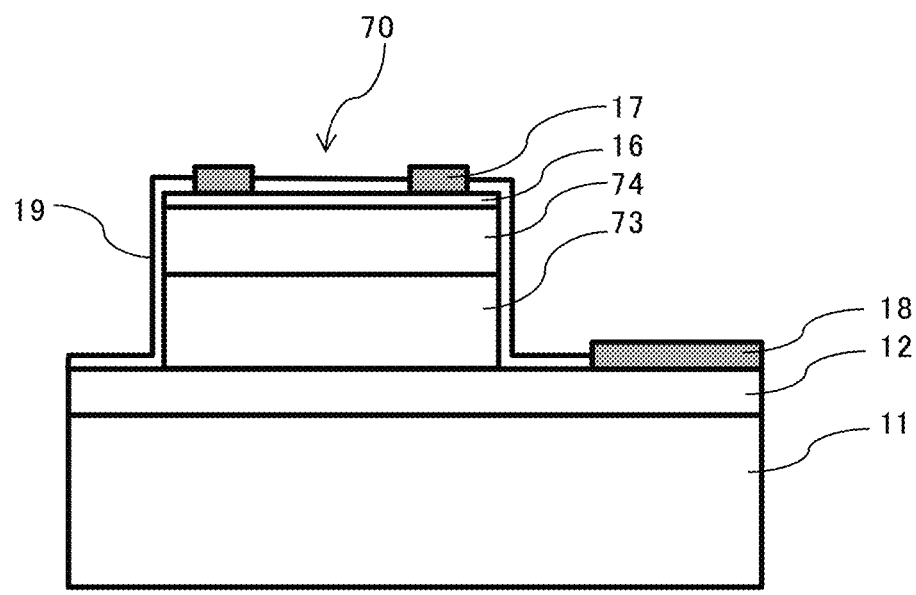
FIG. 9A is a cross-sectional view of a semiconductor light-receiving element according to a fourth example implementation.
Figure 9B:
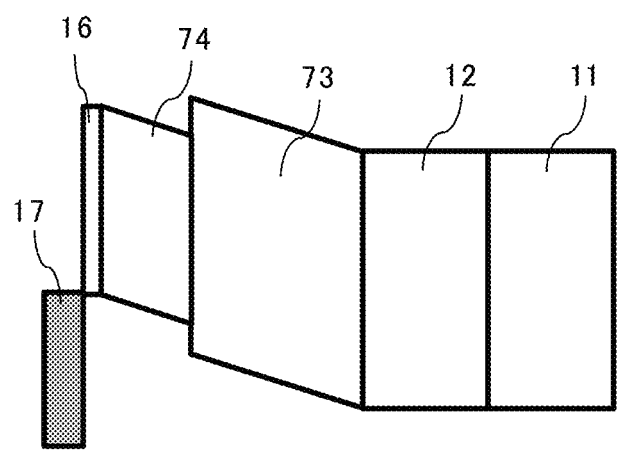
FIG. 9B is a band diagram of the semiconductor light-receiving element according to the fourth example implementation.

FIG. 9A is a cross-sectional view of a semiconductor light-receiving element 70 according to a fourth example implementation. FIG. 7B shows a band diagram when a reverse bias voltage is applied to the semiconductor light-receiving element 70. Differences from the semiconductor light-receiving element 10 described in the first example implementation reside in that the n-type low-concentration InGaAs absorption layer 13 is replaced by an n-type low-concentration InP wide band gap layer 73 having a carrier concentration of $1 \times 10^{15}/cm^3$, and in that a p-type low-concentration InGaAs absorption layer 74 has a thickness of 0.8 μm. The p-type low-concentration InGaAs absorption layer 74 has a carrier concentration of $2 \times 10^{15}/cm^3$, which is the same as in the first example implementation. Carriers of the n-type low-concentration InP wide band gap layer 73 may be intentionally doped or contained in the background. The n-type low-concentration InP wide band gap layer 73 has a thickness of 1.5 μm. In other words, the absorption layer is only the p-type low-concentration InGaAs absorption layer 74, and has a thickness of 0.9 μm. The other configurations are the same as with the semiconductor light-receiving element 10.

The n-type low-concentration InP wide band gap layer 73 has an InP band gap wavelength that is shorter than the wavelength of from 840 nm to 950 nm of the incident light, and hence does not act as an absorption layer. However, the carrier concentration may be less than $1 \times 10^{16}/cm^3$, and hence may be a depleted layer. Of carriers generated in the p-type low-concentration InGaAs absorption layer 74, only electrons are allowed to drift at high speed by the internal electric field. In this manner, the structure reduces an element capacitance while suppressing increases in carrier Movement time. In order to increase high-speed responsiveness of the semiconductor light-receiving element, in addition to the reduction in capacitance, it may be important how fast the carriers exit the absorption layer. This structure may be superior in the latter viewpoint. As long as the layer serves as a wide band gap for the wavelength of incident light, implantations described herein may not be limited to the InP layer, and an InAlAs layer or an InAlGaAs layer may be used, for example.

Figure 10:
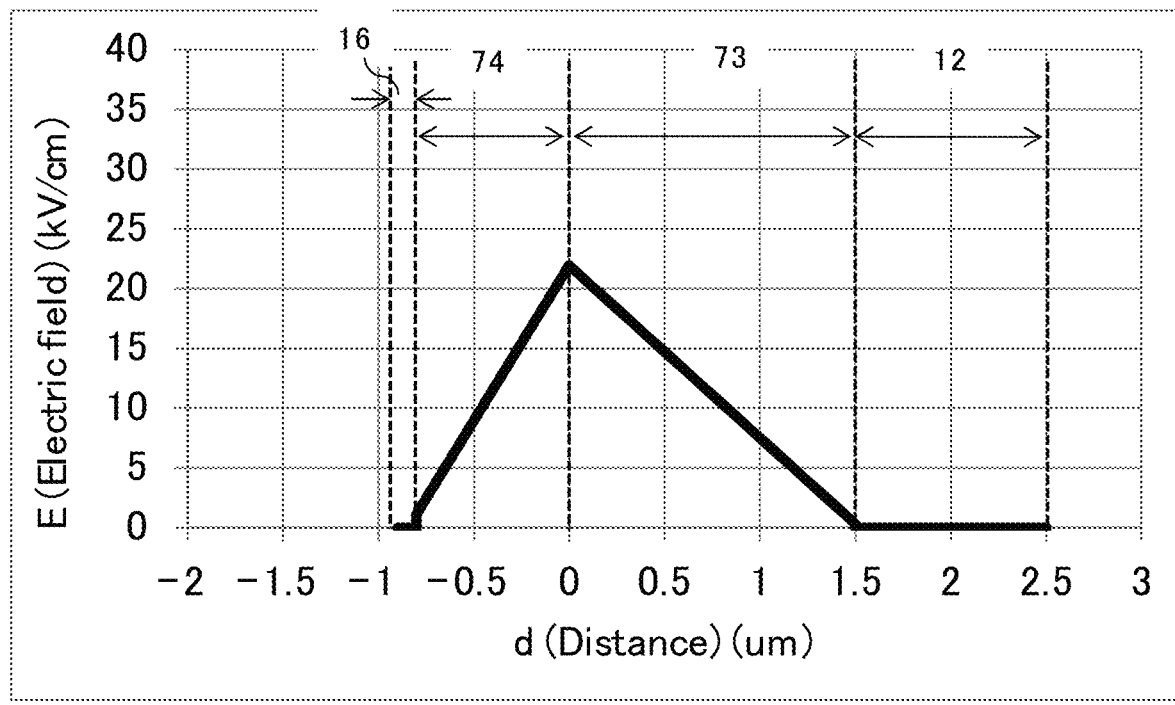
FIG. 10 is a graph showing an electric field strength of the semiconductor light-receiving element according to the fourth example implementation.

FIG. 10 is a graph for showing an electric field strength when a reverse bias voltage of 2 V is applied between the p-type electrode 17 and the n-type electrode 18 of the semiconductor light-receiving element 70. As in FIG. 2, on the horizontal axis, the PN junction interface is set to 0. An area that can be depleted, that is, distances Dn0 and Dp0 from the PN junction interface at which the electric field strength becomes 0 can be determined based on Equation 1, Equation 2, and Equation 3. In the fourth example implementation, the PN junction interface may be the interface between the InGaAs layer and the InP layer, and hence Vb may be 0.59 V. Further, a dielectric constant of InP may be $1.11 \times 10^{-10}$ (F/m). When Vr=2 V and Vb=0.59 V are substituted into Equation 1, Equation 2, and Equation 3, Dp0=0.844 μm and Dn0=1.517 μm are obtained. In other words, both the p-type low-concentration InGaAs absorption layer 74 having the thickness of 0.8 μm and the n-type low-concentration InP wide band gap layer 73 having the thickness of 1.5 μm may all be depleted. In other words, the semiconductor light-receiving element 70 has a small capacitance with the thickness of the depletion layer being as large as 2.3 μm when 2 V is applied, and further is an element capable of high-speed response with excellent carrier spitting performance because of the n-type low-concentration InP wide band gap layer 73. In the fourth example implementation, the n-type low-concentration layer may be the wide band gap layer. However, even when the p-type low-concentration layer is an InP wide band gap layer, and the n-type low-concentration layer is an n-type InGaAs absorption layer to the contrary, a wide depletion layer can be obtained as in the fourth implementation.

As described in the fourth example implementation, it is not always required to make the low-concentration layer of only a material with a band gap that can absorb incident light, and through adoption of a configuration in which the p-type low-concentration layer and the n-type low-concentration layer each having the carrier concentration of less than $1 \times 10^{16}/cm^3$ form the PN interface, the depletion layer can be enlarged.

Figure 11A:
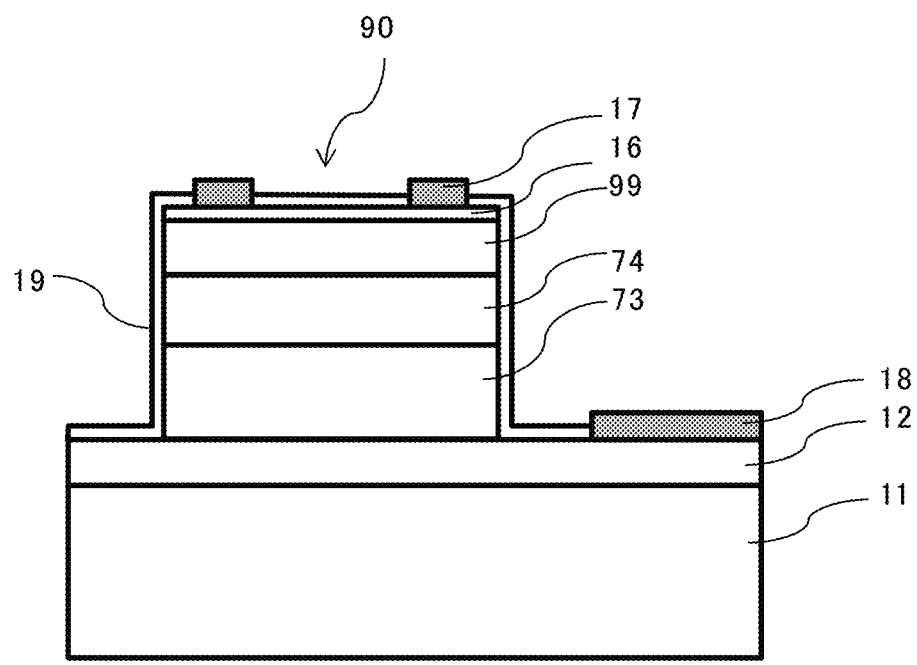
FIG. 11A is a cross-sectional view of a semiconductor light-receiving element according to a modification example of the fourth example implementation.
Figure 11B:
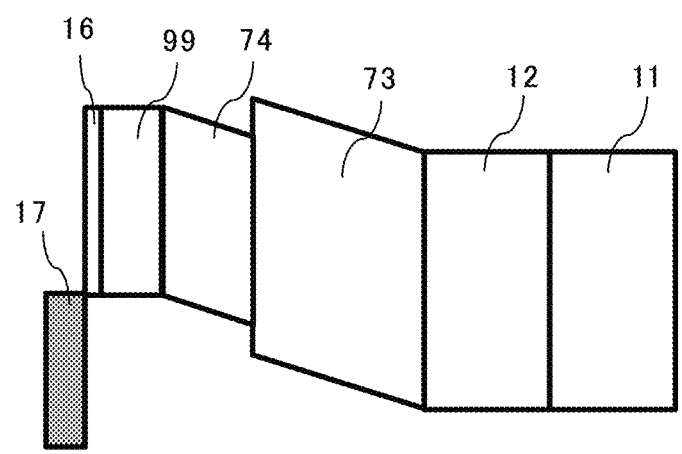
FIG. 11B is a band diagram of the semiconductor light-receiving element according to the modification example of the fourth example implementation.
Figure 12:
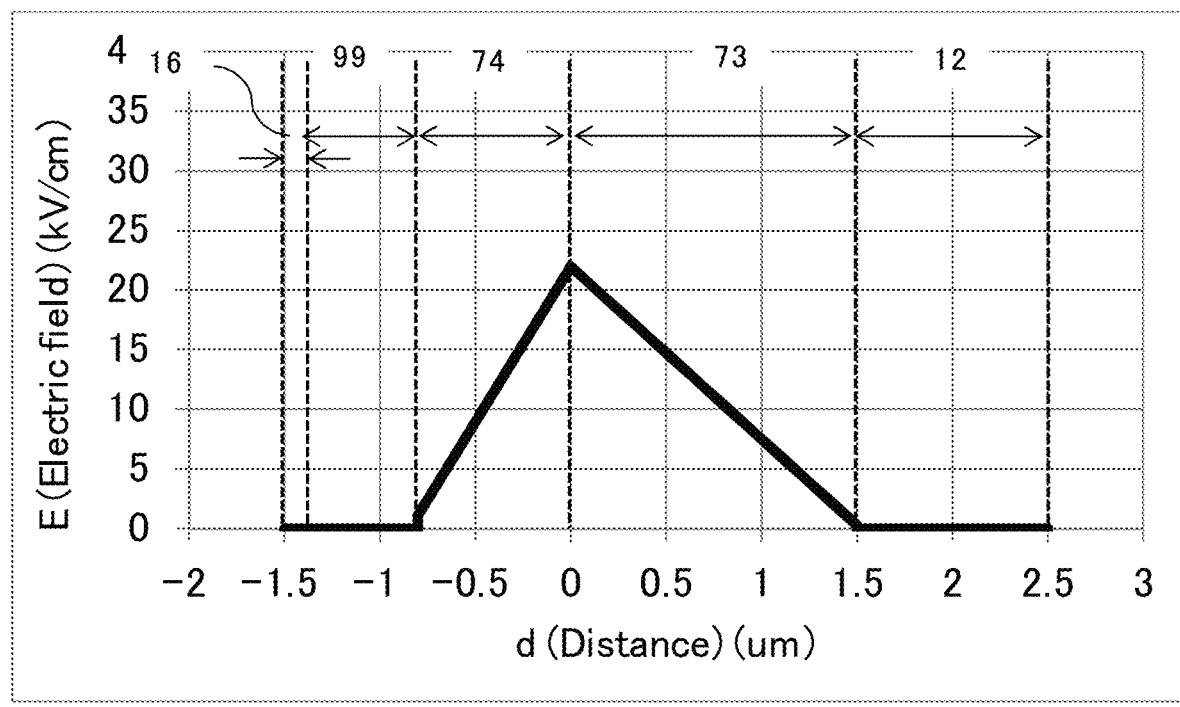
FIG. 12 is a graph showing an electric field strength of the semiconductor light-receiving element according to the modification example of the fourth example implementation.

A modification example implementation of the semiconductor light-receiving element 70 according to the fourth example implementation is described. FIG. 11A is a cross-sectional view of a semiconductor light-receiving element 90 according to the modification example. FIG. 11B shows a band diagram when a reverse bias voltage is applied to the semiconductor light-receiving element 90. FIG. 12 is a graph showing an electric field strength when a reverse bias voltage of 2 V is applied between the p-type electrode 17 and the n-type electrode 18 of the semiconductor light-receiving element 90. A difference from the semiconductor light-receiving element 70 described in the fourth example implementation resides in that a p-type high-concentration InGaAs absorption layer 99 may be interposed between the p-type low-concentration InGaAs absorption layer 74 and the p-type InGaAs contact layer 16. The p-type high-concentration InGaAs absorption layer 99 may be a layer having a thickness of 0.6 μm doped with Be at a concentration of $1 \times 10^{18}/cm^3$. The p-type high-concentration InGaAs absorption layer 99 may have a carrier concentration of $1 \times 10^{16}/cm^3$ or more, and hence may not be depleted with a voltage of about several V. Therefore, the effect of reducing the capacitance with the provision of this p-type high-concentration InGaAs absorption layer 99 is not obtained. However, the p-type high-concentration InGaAs absorption layer 99 has a band gap that absorbs the incident light, and hence is effective to increase light receiving sensitivity. An actual depletion layer of the semiconductor light-receiving element 90 may be the same as that of the semiconductor light-receiving element 70 described in the fourth example implementation. The p-type high-concentration InGaAs absorption layer 99 may have a concentration gradient. It should be noted, however, that even an area with the lowest concentration has a concentration that is not depleted when applied with a bias voltage that is applied under use conditions. Specifically, a concentration of 1×10/cm$^3$ or more may be preferred. Further, an n-type low-concentration InGaAs absorption layer may be interposed between the p-type low-concentration InGaAs absorption layer 74 and the n-type low-concentration InP wide band gap layer 73 as in the first example implementation.

Generating the layers to be depleted to have the thicknesses derived from Equation 1, Equation 2, and Equation 3 may be better in low capacitance and high-speed responsiveness, but the low-concentration layers may be formed as layers that are about 10% thicker than the layer thicknesses that can be depleted, which are derived from Equation 1, Equation 2, and Equation 3. In this case, there is a layer of the p-type low-concentration layer that is not depleted near the interface with the p-type high-concentration layer or a layer of the n-type low-concentration layer near the interface with the n-type high-concentration layer. However, those layers are not thick, and hence do not have a significant effect on degradation in carrier spitting performance and are at a practicable level.

The effects of some implementations described herein can be obtained when the structures described in the example implementations described above are combined with each other. In other words, as long as at least one of the n-type low-concentration layer or the p-type low-concentration layer includes an absorption layer that absorbs incident light, the n-type low-concentration layer and the p-type low-concentration layer may be formed of two layers: the absorption layer and the wide band gap layer, or only one thereof. Further, the n-type low-concentration layer and the p-type low-concentration layer may have the same thickness, the n-type low-concentration layer may be thicker than the p-type low-concentration layer, or the n-type low-concentration layer may be thinner than the p-type low-concentration layer. Still further, the top illuminated semiconductor light-receiving element capable of receiving the optical signal having the wavelength of from 840 nm to 950 nm has been described. However, a top illuminated semiconductor light-receiving element or a back illuminated semiconductor light-receiving element capable of receiving an optical signal of another wavelength band, for example, a 1.3-μm band or a 1.55-μm band, may be adopted. Further, the fiber into which the optical signal is input may be a single-mode fiber. Still further, in the implementations described above, the structure in which the n-type is located closer to the InP substrate side has been described. However, some implementations described herein are not limited thereto, and similar effects can be obtained even when the structure in which the polarities are opposite, that is, the p-type may be located closer to the InP substrate side. Still further, a conductive semiconductor substrate may be adopted instead of the semi-insulating InP substrate.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor light-receiving element, comprising:
   a semiconductor substrate;
   a high-concentration layer of a first conductivity type formed on the semiconductor substrate;
   a low-concentration layer of the first conductivity type formed on the high-concentration layer of the first conductivity type and in contact with the high-concentration layer of the first conductivity type;
   a low-concentration layer of a second conductivity type configured to form a PN junction interface together with the low-concentration layer of the first conductivity type; and
   a high-concentration layer of the second conductivity type formed on the low-concentration layer of the second conductivity type and in contact with the low-concentration layer of the second conductivity type, wherein:

the low-concentration layer of the first conductivity type and the low-concentration layer of the second conductivity type each having a carrier concentration of less than $1\times10^{16}/cm^3$, the high-concentration layer of the first conductivity type having a higher carrier concentration than the low-concentration layer of the first conductivity type, the high-concentration layer of the second conductivity type having a higher carrier concentration than the low-concentration layer of the second conductivity type, the high-concentration layer of the first conductivity type and the high-concentration layer of the second conductivity type each having a carrier concentration of $1\times10^{17}/cm^3$ or more, and at least one of the low-concentration layer of the first conductivity type or the low-concentration layer of the second conductivity type including an absorption layer with a band gap that absorbs incident light.

2. The semiconductor light-receiving element of claim 1, wherein the low-concentration layer of the first conductivity type has a thickness that is 1.1 times a thickness Dn0 or less, the thickness Dn0 being defined by Equation 1, Equation 2, and Equation 3, and wherein the low-concentration layer of the second conductivity type has a thickness that is 1.1 times a thickness Dp0 or less, the thickness Dp0 being defined by Equation 1, Equation 2, and Equation 3:

$$Dp0 = \sqrt{\frac{2\cdot(Vr+Vb)}{\left(\frac{q}{\varepsilon p}\right)\cdot Np\cdot Rp}} \qquad \text{[Equation 1]}$$

$$Rp = 1+(\varepsilon n/\varepsilon p)\cdot(Np/Nn) \qquad \text{[Equation 2]}$$

$$Dn0 = (Rp-1)\cdot Dp0 \qquad \text{[Equation 3]}$$

wherein:
Vr: bias voltage applied from outside
Vb: built-in potential
q: elementary charge
εp: dielectric constant of the low-concentration layer of the second conductivity type
εn: dielectric constant of the low-concentration layer of the first conductivity type.

3. The semiconductor light-receiving element of claim 2, wherein the thickness of the low-concentration layer of the first conductivity type is the thickness Dn0 or less, and wherein the thickness of the low-concentration layer of the second conductivity type is the thickness Dp0 or less.

4. The semiconductor light-receiving element of claim 1, wherein:

the high-concentration layer of the first conductivity type is a contact layer of the first conductivity type, the low-concentration layer of the first conductivity type is a low-concentration InGaAs absorption layer of the first conductivity type with a band gap that absorbs incident light, the low-concentration layer of the second conductivity type is a low-concentration InGaAs absorption layer of the second conductivity type with a band gap that absorbs incident light, and the high-concentration layer of the second conductivity type is a contact layer of the second conductivity type.

5. The semiconductor light-receiving element of claim 1, wherein:

the high-concentration layer of the first conductivity type is a contact layer of the first conductivity type, the low-concentration layer of the first conductivity type is a low-concentration wide band gap layer of the first conductivity type with a band gap that does not absorb incident light, the low-concentration layer of the second conductivity type is a low-concentration InGaAs absorption layer of the second conductivity type with a band gap that absorbs incident light, and the high-concentration layer of the second conductivity type is a contact layer of the second conductivity type.

6. The semiconductor light-receiving element of claim 5, wherein the low-concentration wide band gap layer of the first conductivity type is made of one of InP, InAlAs, and InAlGaAs.

7. The semiconductor light-receiving element of claim 1, wherein the first conductivity type is an n-type, and the second conductivity type is a p-type.

8. The semiconductor light-receiving element of claim 7, wherein the low-concentration layer of the first conductivity type is thinner than the low-concentration layer of the second conductivity type.

9. The semiconductor light-receiving element of claim 1, wherein one of the low-concentration layer of the first conductivity type and the low-concentration layer of the second conductivity type that is closer to a surface on which light enters is thinner than another one of the low-concentration layer of the first conductivity type and the low-concentration layer of the second conductivity type.

* * * * *